(12) United States Patent
Omer et al.

(10) Patent No.: US 9,190,963 B2
(45) Date of Patent: Nov. 17, 2015

(54) SYSTEM AND METHOD FOR FAST POLYNOMIAL PRE-DISTORTION

(71) Applicant: BlackBerry Limited, Waterloo (CA)

(72) Inventors: Mohammad Omer, Waterloo (CA);
Oleksiy Kravets, Petersburg (CA);
Stephen Arnold Devison, Kitchener (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 123 days.

(21) Appl. No.: 13/973,397

(22) Filed: Aug. 22, 2013

(65) Prior Publication Data

US 2015/0054579 A1 Feb. 26, 2015

(51) Int. Cl.
*H03F 1/26* (2006.01)
*H03F 1/32* (2006.01)
*H03F 3/189* (2006.01)
*H03F 3/24* (2006.01)

(52) U.S. Cl.
CPC ............ *H03F 1/3247* (2013.01); *H03F 1/3258* (2013.01); *H03F 3/189* (2013.01); *H03F 3/245* (2013.01)

(58) Field of Classification Search
CPC ........................................................ H03F 1/26
USPC ................. 330/149; 375/296–297; 455/114.3
See application file for complete search history.

(56) References Cited

U.S. PATENT DOCUMENTS

8,446,979 B1    5/2013   Yee

*Primary Examiner* — Khanh V Nguyen
*Assistant Examiner* — Khiem Nguyen
(74) *Attorney, Agent, or Firm* — Perry + Currier Inc.

(57) ABSTRACT

A system and method of pre-distorting a signal applied to a power amplifier to compensate for distortion introduced by the power amplifier at different power settings, comprising pre-distorting the signal according to a pre-distortion polynomial, prior to amplification of the signal by the power amplifier; adaptively estimating and applying pre-distortion polynomial coefficients to the pre-distorter by saving successive iterations of adaptive estimation of the pre-distortion polynomial coefficients; and regularizing estimation of the pre-distortion polynomial coefficients over successive iterations according to a modified objective function that initially constrains growth in the magnitude of the pre-distortion polynomial coefficients and then relaxes the constraint in growth over successive iterations until estimation is reduced to a steady-state least squares estimation.

14 Claims, 7 Drawing Sheets

SYSTEM AND METHOD FOR FAST POLYNOMIAL PRE-DISTORTION

TECHNICAL FIELD

Example embodiments relate to pre-distorting a signal applied to a power amplifier to compensate for distortion introduced by the amplifier at different power settings, and more particularly to a fast polynomial pre-distortion that is fully agnostic to pre-characterization performed on the power amplifier and that quickly converges in response to power stepping.

BACKGROUND

Radio-frequency (RF) mobile communication devices use digital hardware and digital signal processing techniques at baseband in conjunction with analog circuitry to condition a signal for transmission via an antenna. The final stage of conditioning prior to transmission involves amplifying the signal using a power amplifier.

It is desirable to operate the power amplifier near saturation in order to attain high power efficiency. However, efficiency in a power amplifier is achieved with the penalty of an inherently non-linear signal transfer characteristic, which is typically a complex function involving temperature dependence.

Pre-distortion has been used which, in its simplest form, involves distorting the transmission signal prior to amplification, using a polynomial function that is the inverse to the distortion introduced by the power amplifier, thereby linearizing the behavior of the power amplifier. In order to create a pre-distortion model for inverting the nonlinearity introduced by the power amplifier, an iterative method is used where the input to and output from the power amplifier are repeatedly passed through an estimator, and statistical methods are used to perform linear and nonlinear regression on the signal data.

However, since mobile communication devices operate under different radio power output conditions, non-linear distortion of the transmission signal by the power amplifier may change when there is a power step. This can result in spectrum re-growth, which diverts some of the energy from a desired frequency channel into adjacent frequency channels. This, in turn, results in a loss of performance within a desired frequency channel as well as the creation of interference within adjacent frequency channels.

In order to compensate for each of these nonlinear profiles, a slightly different polynomial curve must be used. Therefore, prior art systems require either pre-characterization of the device to create pre-distorting look-up tables (LUTs), or the use of real time polynomial estimators.

According to the LUT approach, the nonlinearity is pre-characterized during factory calibration of the device such that different polynomial coefficients are stored in the LUT for each power operating point. The different coefficients are instantly fetched based on the output power requirements. LUTs provide stable pre-distortion but suffer from very slow convergence time as each amplitude bin is individually trained, as well as suffering from increased memory and computational requirements for storage and fetching of the coefficients from the LUT. Also, the LUT does not work correctly in the event the response of the amplifier deviates from the pre-characterized coefficient tables.

Real time polynomial estimators converge rapidly but suffer from instability. This is because a small change in polynomial coefficients can lead to a large change in the behavior of the polynomial. In the initial phase during which the system is converging, the radio transmitter will generate significant nonlinear distortion that may violate spectral mask requirements and exceed the maximum acceptable bit error rate. The perturbation generated in the initial phase of the estimation can be so strong that it leads to instability of the entire estimation process. One solution to the instability problem is to let the pre-distortion system train to the new power level before transmitting the signal. However, this wastes valuable transmission time and compromises the overall data throughput of the communication system.

Reference will now be made to the exemplary embodiments illustrated, and specific language will be used herein to describe the same. It will nevertheless be understood that no limitation of the scope of protection is thereby intended.

DETAILED DESCRIPTION OF EXAMPLE EMBODIMENTS

In accordance with an example embodiment, there is provided a system for pre-distorting a signal applied to a power amplifier to compensate for distortion introduced by the power amplifier at different power settings, comprising a pre-distorter for pre-distorting the signal according to a pre-distortion polynomial, prior to amplification of the signal by the power amplifier; an adaptive estimator for adaptively estimating and applying pre-distortion polynomial coefficients to the pre-distorter, wherein the adaptive estimator includes a first estimation loop for saving successive iterations of the adaptive estimator; and a second estimation loop including an estimation regularizer for regularizing estimation of the pre-distortion polynomial coefficients over successive iterations according to a modified objective function that initially constrains growth in the magnitude of the pre-distortion polynomial coefficients and then relaxes the constraint in growth over successive iterations until estimation is reduced to a steady-state least squares estimation.

According to another aspect, there is provided a method of pre-distorting a signal applied to a power amplifier to compensate for distortion introduced by the power amplifier at different power settings, comprising pre-distorting the signal according to a pre-distortion polynomial, prior to amplification of the signal by the power amplifier; adaptively estimating and applying pre-distortion polynomial coefficients to the pre-distorter by saving successive iterations of adaptive estimation of the pre-distortion polynomial coefficients; and regularizing estimation of the pre-distortion polynomial coefficients over successive iterations according to a modified objective function that initially constrains growth in the magnitude of the pre-distortion polynomial coefficients and then relaxes the constraint in growth over successive iterations until estimation is reduced to a steady-state least squares estimation.

Well known prior art estimators use data at the input and output terminals of the power amplifier to adaptively estimate pre-distortion polynomial coefficients that are applied in the forward pre-distortion path to accomplish the pre-distortion. As discussed briefly above, such prior art pre-distorters do not behave well to input power stepping. This can be seen in FIG. 1, which shows the characteristic curves of a nonlinear power amplifier (curve 100), a pre-distorter (curve 110) for compensating the nonlinear power amplifier characteristic and the resulting linear behavior (curve 120).

Figure 1:
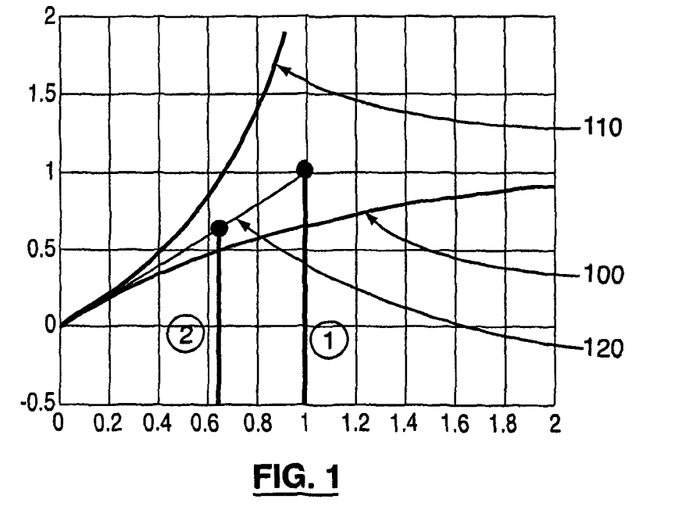
FIG. 1 is a graph showing the characteristic curves of a nonlinear power amplifier, a pre-distorter for compensating the nonlinear power amplifier characteristic and the resulting linear behavior.

If the amplifier is operated at an average power given by point 1, it will exhibit the full expanse of nonlinear characteristics (assuming the input signal has a certain nonzero Peak-to-Average-Power-Ratio PAPR). If the amplifier is operated at point 2, most of the nonlinear characteristic function of the amplifier is never visited by the input signal.

Figure 2:
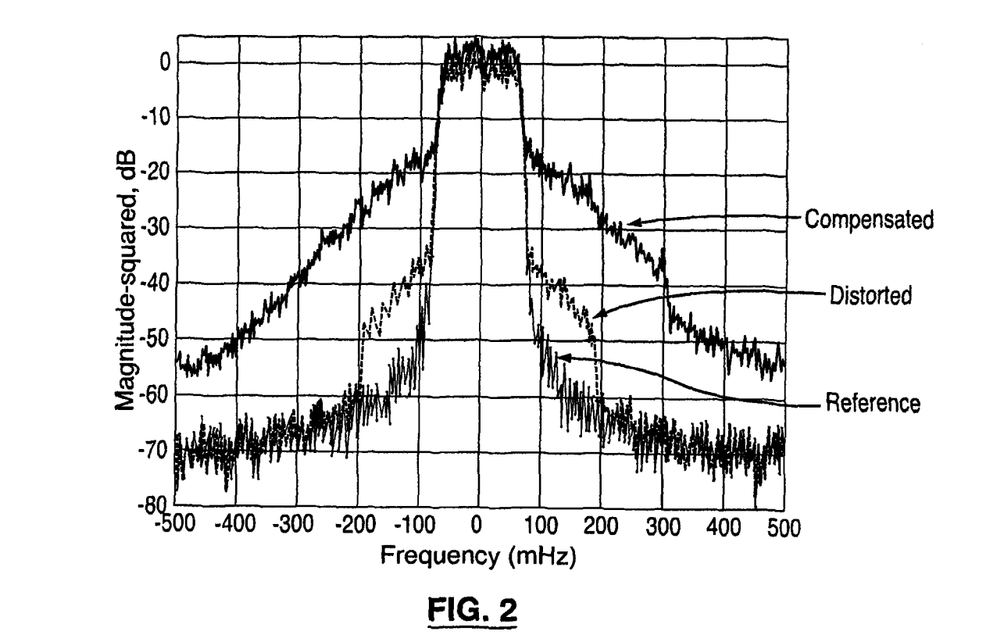
FIG. 2 is a graph of adjacent channel leakage ratio (ACLR) during the initial phase of polynomial estimation following power stepping.
Figure 3A:
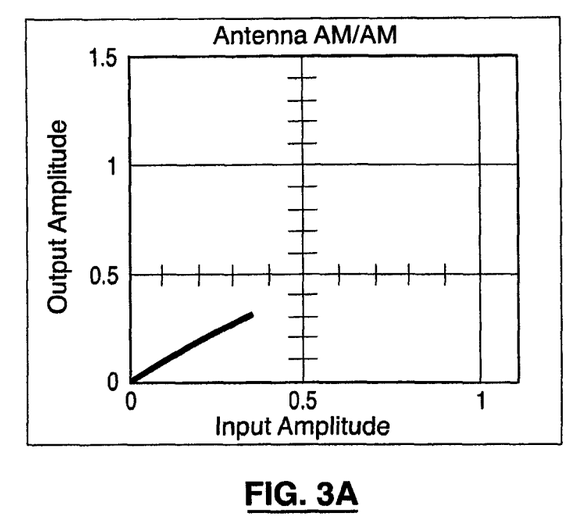
FIGS. 3A and 3B are graphs showing the characteristic curves for the power amplifier and pre-distorter, respectively, for the new power level.
Figure 3B:
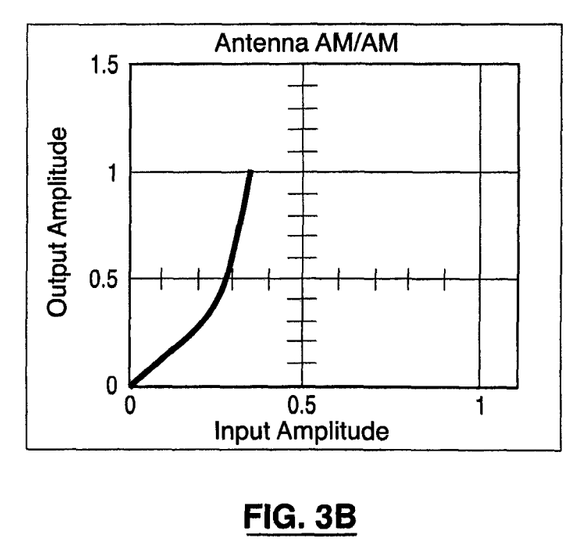

If power stepping occurs such that the pre-distorter is subjected to a different power level at its input, the pre-distorter learns while trying to extrapolate from the known polynomial. This can lead to sudden spectral re-growth, as shown in FIG. 2. The reason for this sudden spectral regrowth can be understood by observing the amplifier characteristic in FIG. 3A and comparing it with the pre-distorter characteristic in FIG. 3B, from which it will be noted that while the nonlinear characteristics of the amplifier are mildly nonlinear, the pre-distorter is extrapolating without bound in the highly nonlinear region. This behavior can impact both the amplitude and phase inverse curve estimation.

According to an exemplary embodiment, the problem of pre-distorter instability during a power stepping transient is addressed by formulating a constrained optimization problem to determine the coefficients of the pre-distortion polynomial such that the learning behavior of the pre-distorter is stabilized, thereby reducing distortion during the training process. As a result, the pre-distorter converges to the conventional polynomial pre-distortion in the steady state when the power stepping transient has died away. According to the exemplary embodiment there is no requirement for pre-calibration, such that the exemplary embodiment is agnostic to specific amplifiers or classes of amplifiers. This allows it to be applied broadly to different nonlinearities with different defining characteristics.

As discussed in greater detail below, the weighted constrained optimization problem uses a modified objective function that has contributions from two different and unrelated quantities. The first quantity is the estimation error of the polynomial estimator, which must be minimized. The second quantity is the squared norm of the pre-distortion coefficients. This quantity is added to the error with a weight applied to it. The purpose of this quantity is to penalize the estimation process if the magnitude of the polynomial coefficients starts to grow large. The use of this technique avoids any hard limiting number on the polynomial coefficients themselves. The structure of the exemplary estimator allows the estimation of coefficients to proceed according to the modified objective function. The modified objective function provides flexibility by trading off the tightness of the constraint (robustness to transient and extrapolation) with performance in terms of adjacent channel leakage ratio (ACLR) and error vector magnitude (EVM). The exemplary pre-distorter also exhibits good steady state performance by relaxing the constraint between successive estimation iterations. Once the first pass of polynomial coefficient estimation is over, the constraint on the polynomial weights can be relaxed by reducing their contribution into the objective function of the estimator. This relaxation can continue between successive iterations until the estimation problem is reduced to purely least squares estimation. This permits consistent steady state as well as transient performance.

Figure 4:
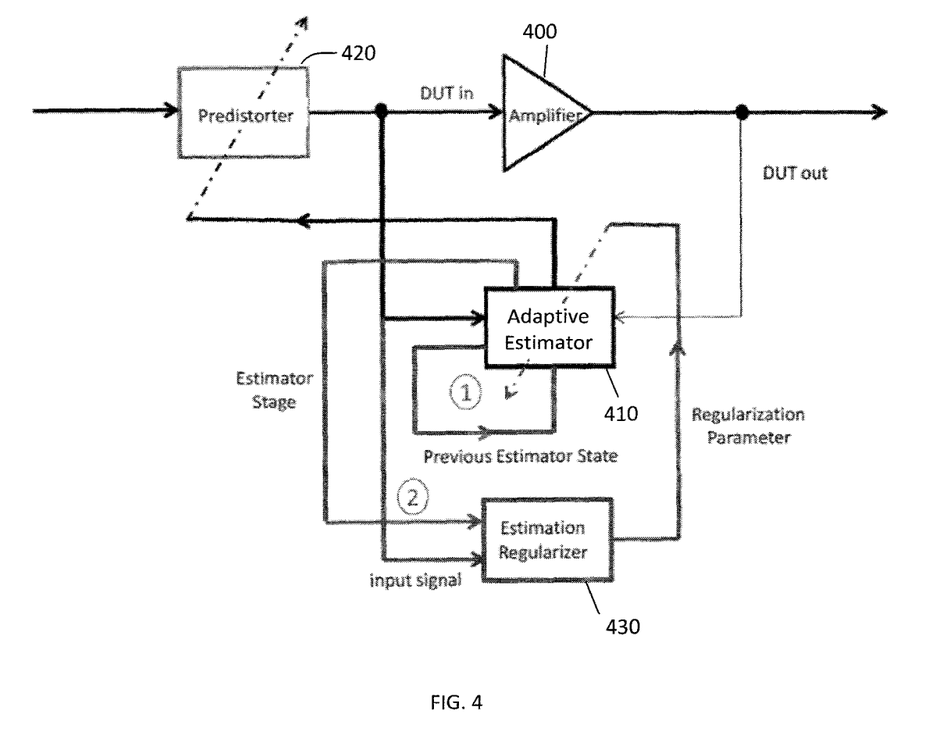
FIG. 4 is a block diagram of a fast polynomial pre-distorter, according to an exemplary embodiment.

FIG. 4 is a block diagram of a fast polynomial pre-distorter, according to an exemplary embodiment. As with conventional prior art estimators data at the input (DUT in) and output (DUT out) of a power amplifier 400 are applied to an estimator 410 to adaptively estimate pre-distortion polynomial coefficients that are applied in the forward pre-distortion path to the pre-distorter 420 for pre-distorting the signal prior to amplification by power amplifier 400. However, according to the exemplary embodiment, the traditional pre-distortion architecture is augmented by using two additional estimation loops, identified by a circled 1 and a circled 2 in FIG. 4. As discussed above, pre-distortion in a conventional system is achieved by adaptively tuning the polynomial weights 'on the fly' based on data captured from the input and output of the power amplifier. Loops 1 and 2 adapt the adaptive estimator itself. The estimator 410 is therefore tuned at the same time that it is tuning the pre-distortion polynomial coefficients. The dashed arrow across the estimator 410 indicates that the estimator block undergoes a transformation while the system is working, in the same way that the conventional pre-distorter 420 adapts as a result of real-time change in pre-distortion coefficients.

The purpose of loop 1 is to use internal states of the estimator to act as a seed for subsequent iterations. In other words, all of the statistical estimation metrics are collected from the current estimation and are used in the next estimation iteration after the pre-distorter has processed the signal using the estimated coefficients. This iterative estimation is used to enable the second loop in the system (loop 2). The purpose of loop 2 is to 'dampen' or 'sharpen' the estimator 410 based on the state of the current estimation cycle. This is accomplished by changing the estimator 410 from iteration-to-iteration using an estimation regularizer 430. According to the exemplary embodiment, when a new power level is detected the estimator 410 is conservative in its estimation but very stable in generating the coefficients, so that no overshoot occurs. As the estimation progresses, the estimator 410 becomes increasingly 'sharp', providing for greater and greater accuracy because the coefficients have been stabilized due to the iterative nature of the loop. As discussed below, adaptivity of the exemplary estimator 410 is accomplished in a mathematically consistent manner without employing any heuristic workarounds or randomly imposed constraints.

Figure 5:
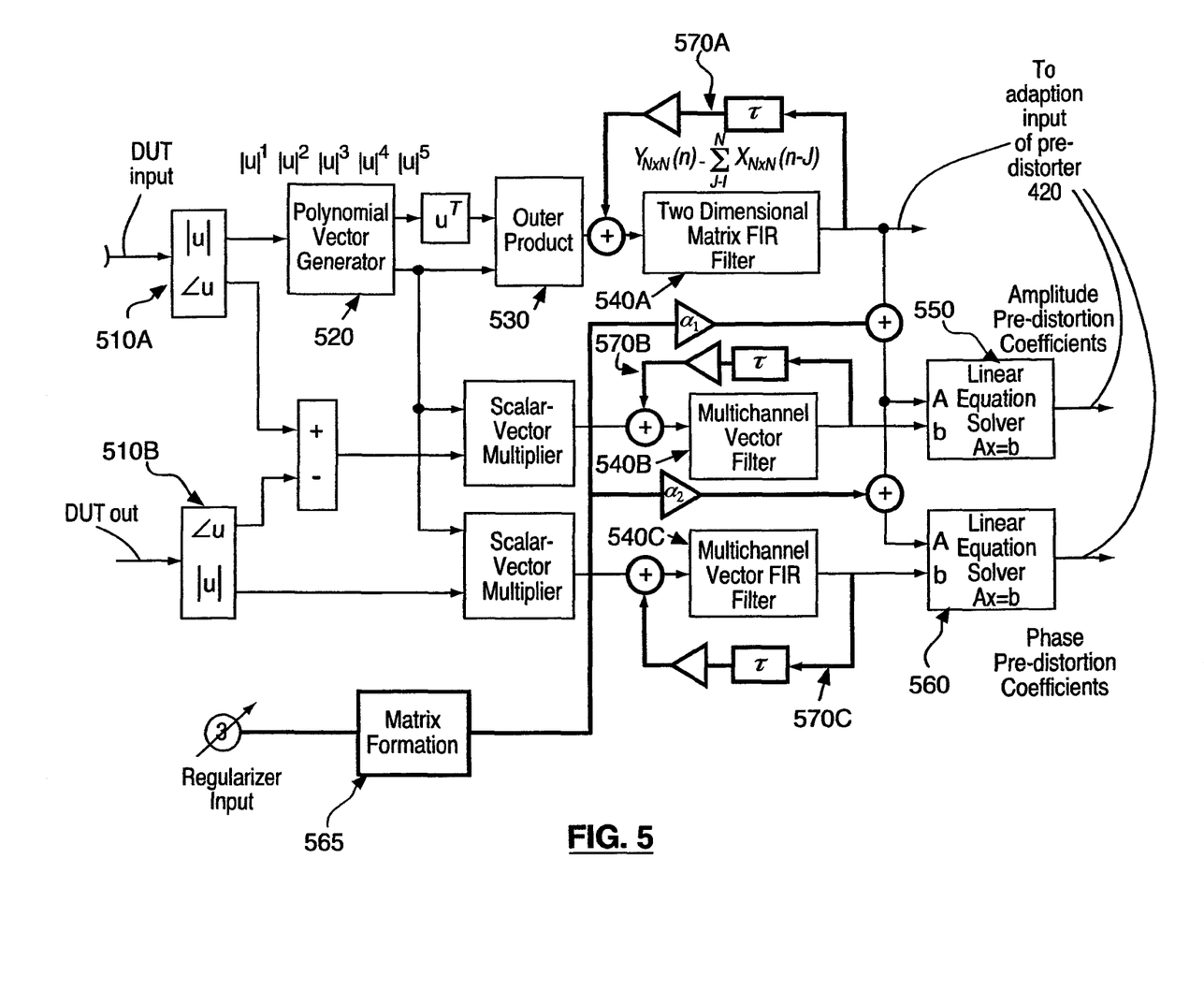
FIG. 5 is a block diagram of an estimator block of the fast polynomial pre-distorter depicted in FIG. 4.

FIG. 5 shows details of the estimator 410. A pair of complex-to-magnitude (|u|) and phase (<u) converters 510A and 510B establish two parallel estimation paths for the magnitude and phase. Hence AM/AM and AM/PM distortion is corrected independently. The magnitude of the DUT in signal? is fed to a polynomial generator 520 that generates a vector of different polynomial powers. This vector is then used to form an outer product 530 hence generating a matrix 540A that is averaged over time to create an input to the linear equation solvers 550 and 560, which in turn generate least squares estimates of the amplitude and phase pre-distortion coefficients, respectively, for the pre-distorter 420.

The third port of the system (Regularizer input) is applied to a Matrix Formation block 565, and is shown with a cross arrow representing the adaptive port for changing the characteristics of the estimator 'on the fly'. The feedback loops 570A, 570B and 570C implement loop 1 in FIG. 4, such that statistical metrics calculated during each iteration of the estimator are delayed by an iteration interval ($\tau$) and added to the newly calculated matrices 540A, 540B and 540C, after passing through a multiplicative weighing coefficient. This allows the estimator to remember its past history of data inputs and hence go from moderate accuracy in coefficient estimation to high estimation accuracy once the power stepping transient has died away. Loop 2 is represented in FIG. 5 by Matrix Formation block 565 and the feed forward paths comprising multipliers $\alpha_1$ and $\alpha_2$.

As with conventional pre-distortion coefficient estimators, the estimator 410 estimates coefficients representing the inverse amplifier characteristics by using the input and output signal of amplifier 400. The inverse characteristics are formed for both the amplitude and phase nonlinearities, as shown in FIG. 5. According to the mathematics of the least squares implementation of FIG. 5, a tall matrix A of the input signal amplitude powers is used, as follows:

$$A = \begin{bmatrix} x(n) & x(n)^2 & x(n)^3 & x(n)^4 & x(n)^5 \\ x(n-1) & x(n-1)^2 & x(n-1)^3 & x(n-1)^4 & x(n-1)^5 \\ . & . & . & . & . \\ . & . & . & . & . \\ . & . & . & . & . \\ . & . & . & . & . \\ . & . & . & . & . \\ x(n-L) & x(n-L)^2 & x(n-L)^3 & x(n-L)^4 & x(n-L)^5 \end{bmatrix}$$

where x represents the amplitude of the normalized DUT output and L represents the data buffer length being used for estimation. The least squares formulation is solved using the input and output signal amplitude as follows: x: $A_{mag} w_{mag} = b_{mag}$, where b represents the vector of input signal amplitudes. The parallel phase problem is solved using the input and output signal phase difference: $A_{mag} w_{phase} = b_{mag}$, where b represents the difference in phase of the DUT input and DUT output. The A matrix in both equations remains the same for AM/AM and AM/PM correction. Hence AM is the common x-axis for both the inverse amplitude and phase functions. Since both the amplitude and phase equations are solved in parallel, the following discussion describes only the modifications applied to a general least squares equation, with amplitude and phase as special cases.

A general least squares solution for the equation of the form: Aw=b is given by $w=(A^TA)^{-1}A^Tb$. The matrix $A^TA$ is computed in the top most branch of FIG. 5, while the vector $A^Tb$ is calculated for amplitude in the second branch and phase in the third branch of FIG. 5. The least squares criterion is achieved by minimizing the equation error in the mean square sense. The derivation below shows this minimization procedure using a first order derivative:

$$Aw=b$$

$$b-Aw=e$$

$$\min\|b-Aw\|_2 = \min\|e\|_2$$

$$J(w)=[(b-Aw)^2]$$

$$\nabla J(w)=A^T(b-Aw)=0$$

$$w=(A^TA)^{-1}A^Tb$$

The least squares equations are reformulated according to the exemplary embodiment, using the Tikhanov regularization, by adding an additional constraint for the norm of the weights into the criterion of least squares. This constraint ensures that the coefficient weights of the resulting solution do not grow too large and thereby destroy the extrapolation properties of the polynomial. The modified least squares criterion and resulting minimization is shown below:

$$J(w, \alpha) = \frac{1}{2}(\underbrace{\|b - Aw\|^2}_{LS\ error} + \underbrace{\alpha\|w\|^2}_{Weight\ norm})$$

$$\nabla J(w, \alpha) = A^T(b - Aw) - \alpha w = 0$$

$$w = (A^TA + \alpha I)^{-1}A^Tb$$

$$w = \left(\underbrace{\boxed{A^TA}}_{} + \underbrace{\boxed{\alpha I}}_{}\right)^{-1}\underbrace{\boxed{A^Tb}}_{}$$

Already available

It will be noted that the solution of least squares problem has been divided into three parts: the least squares (LS) error, $A^TA$ and $A^TB$ represents the conventional estimator structure, whereas the weighted norm and $\alpha I$ are additional computational elements that need to be present to allow estimator tuning (i.e., the loop 1 elements represented by 570A, 570B and 570C, and loop 2 comprises Matrix Formation block 565 and the feed forward paths comprising multipliers $\alpha_1$ and $\alpha_2$).

Finally, the Estimation Regularizer 430 may be implemented, for example, as a simple state machine in order to parameterize the estimator 410 based on the maturity of estimation process. Numerous possible embodiments of Estimation Regularizer 430 are possible based on the design of estimator 410, one of which is illustrated in FIG. 6.

Figure 6:
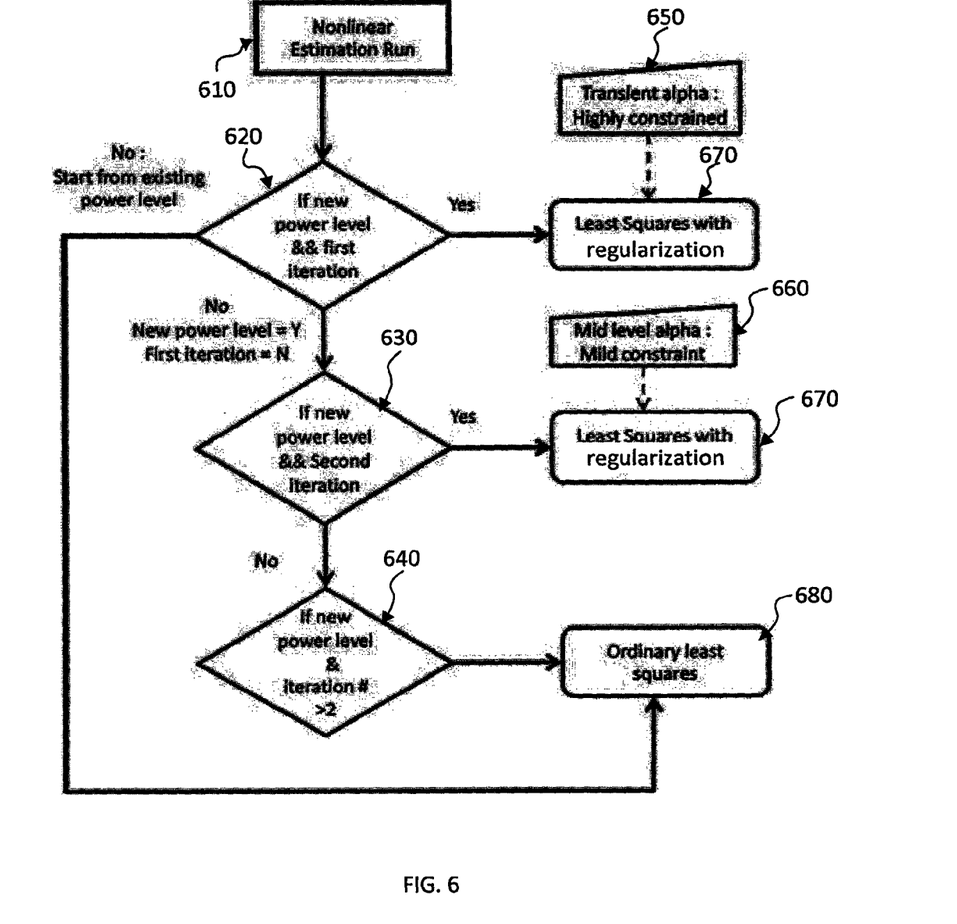
FIG. 6 is a flowchart of an exemplary state machine for implementing a regularize block of the fast polynomial pre-distorter depicted in FIG. 4.

As shown in FIG. 6, and as discussed above, Tikhanov regularization works by penalizing the solution with a large norm of vectors. This means that using regularization does not allow the polynomial coefficients to become very large. In other words, the growth of the polynomials is constrained from rapid and un-inhibited extrapolation in the highly nonlinear operational region of power amplifier 400. The parameter $\alpha$ is tunable and can be adjusted to yield best performance versus stability behavior in the estimator. As shown in FIG. 6, for each nonlinear estimation run (610) following a power step, $\alpha$ is iterative adjusted based on the training stage of the pre-distorter 420. If the pre-distorter is in its first iteration (block 620), the values of $\alpha_1$ (for magnitude equation) and $\alpha_2$ (for phase equation) are kept high. This means that more weight is given to the constraint relative to the actual estimation error in the system. After the first iteration (from blocks 620 to 630), $\alpha$ values are reduced (from 650 to 660) thus making the estimation process via least squares with regularization 670, less constrained and more dependent on the estimation error. In the third or any subsequent iterations (640), the α values are reduced to zero to allow for full training via ordinary least squares (680), with maximum gain on the adjacent channel leakage ratio (ACLR) and bit error rate (BER) quality markers.

As discussed below, iterative modification of the regularization parameter α results in operational stability in the presence of transients and effective compensation characteristics during steady-state operation. The steady state of α can also be manipulated to allow for robustness to variations. For example, if the phase offset correction of the system is disabled, or is not very accurate, the steady state α value can be non-zero in order to improve upon estimation robustness to parametric variation.

Figure 7A:
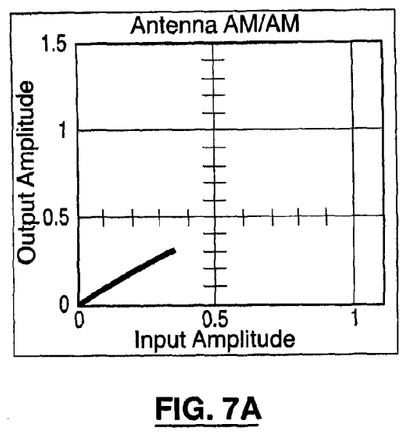
FIGS. 7A and 7B are graphs showing the characteristic curves for the power amplifier and pre-distorter, respectively, during power stepping, for the fast polynomial pre-distorter depicted in FIG. 4.
Figure 7B:
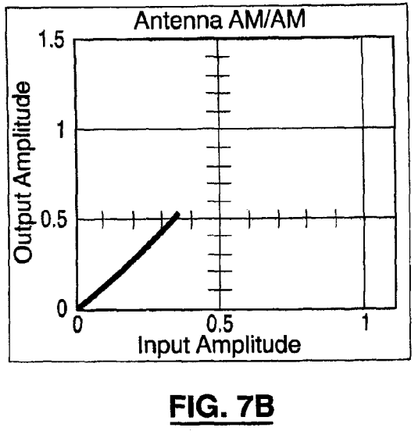
Figure 8:
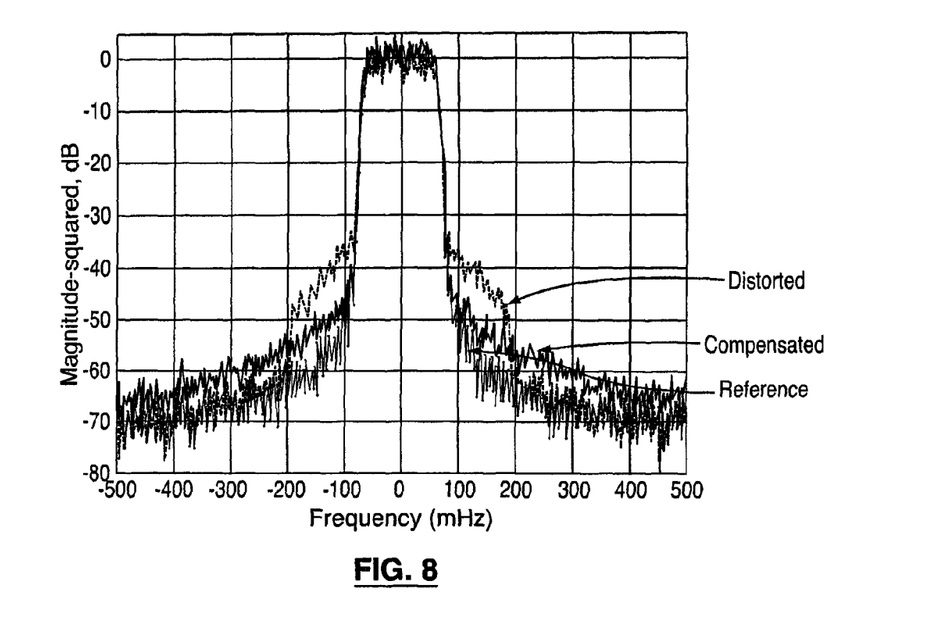
FIG. 8 is a graph of adjacent channel leakage ratio (ACLR) during the initial phase of polynomial estimation for the new power level, for the fast polynomial pre-distorter depicted in FIG. 4.

As shown in FIG. 8, when compared to FIG. 2, the pre-distorter according to the exemplary embodiment exhibits improvement in the ACLR profile of the signal, due to the shape of the generated pre-distortion curve. It will be noted that, when comparing FIG. 7B to FIG. 3B, the pre-distorter curve is no longer growing in an unconstrained fashion in the region of nonlinearity.

Figure 9A:
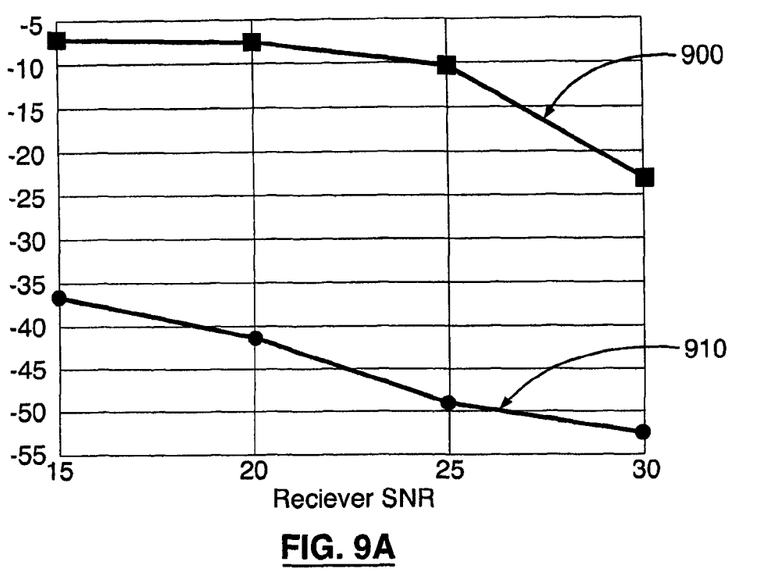
FIG. 9A is a graph showing comparative (ACLR) performance between a conventional pre-distorter and the fast polynomial pre-distorter depicted in FIG. 4, during a first estimation iteration following power stepping.

In another test of the exemplary embodiment, pre-distortion was effected in the presence of a non-ideal receiver. In this scenario, the feedback signal received from amplifier 400 passed through a receiver and was converted into the digital domain. This conversion invariably leads to SNR limitations on the received signal. Noise was then added to the feedback signal to observe the effect of reduced SNR on the quality of pre-distortion. FIG. 9A shows comparative results after the first estimation iteration, where the curve 900 shows the results for the exemplary embodiment and the curve 910 shows the results for a conventional estimator. In the first stage, all polynomial coefficients have been initialized to a fixed value and hence the system has no knowledge of the pre-distortion curve. This stage is therefore most prone to unstable polynomial behavior. It will be noted that exemplary embodiment exhibits improved ACLR performance with a significant margin, which remains nearly constant even for lower values of receiver SNR.

Figure 9B:
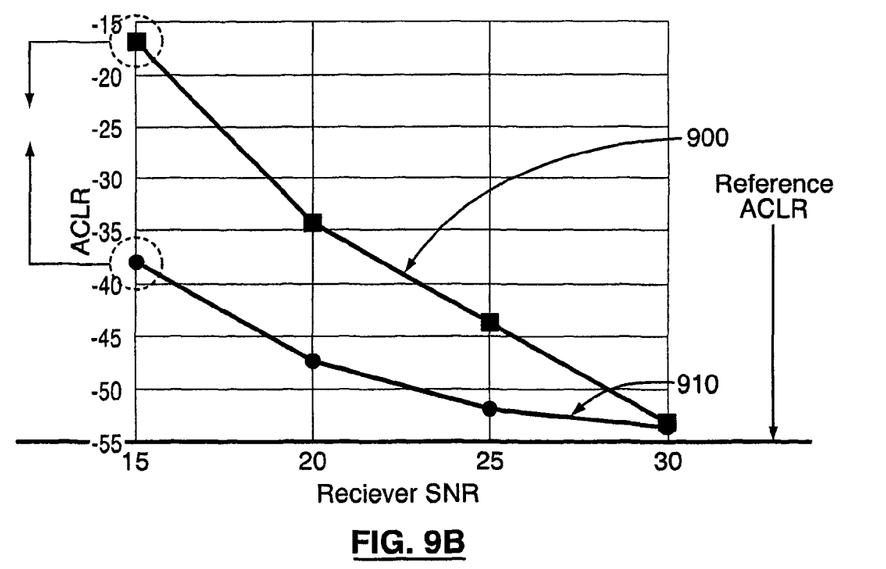
FIG. 9B is a graph showing comparative (ACLR) performance between a conventional pre-distorter and the fast polynomial pre-distorter depicted in FIG. 4, during the second estimation iteration following power stepping.

The results for a subsequent iteration are illustrated in FIG. 9B, where it will be noted that with a modestly large value of received SNR, both the exemplary and conventional pre-distorters meet at the SNR value of 30, which is the minimum possible SNR required to maintain steady-state performance from either system. In practice, ensuring 30 dB of SNR on the receiver is difficult due to differing gains generated by the pre-distorter. However, using the exemplary embodiment, acceptable ACLR performance is maintained even for lower values of receiver SNR, resulting in improved ACLR degradation with the SNR of the received signal.

The various embodiments presented above are merely examples and are in no way meant to limit the scope of this disclosure. Variations of the innovations described herein will be apparent to persons of ordinary skill in the art, such variations being within the intended scope of the present disclosure. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein and in the recited claims intends to cover and embrace all suitable changes in technology.

What is claimed is:

1. A system for pre-distorting a signal applied to a power amplifier to compensate for distortion introduced by the power amplifier at different power settings, comprising:
   a pre-distorter for pre-distorting the signal according to a pre-distortion polynomial, prior to amplification of the signal by the power amplifier;
   an adaptive estimator for adaptively estimating and applying pre-distortion polynomial coefficients to the pre-distorter, wherein the adaptive estimator includes
   a first estimation loop for saving successive iterations of the adaptive estimator; and
   a second estimation loop including an estimation regularizer for regularizing estimation of the pre-distortion polynomial coefficients over successive iterations according to a modified objective function that initially constrains growth in a magnitude of the pre-distortion polynomial coefficients and then relaxes the constraint in growth over successive iterations until an estimation is reduced to a steady-state least squares estimation.

2. The system as in claim 1, wherein the adaptive estimator includes a complex-to-magnitude (|u|) converter and a complex-to-phase (<u) converter for establishing parallel estimation paths for magnitude and phase pre-distortion coefficients, respectively, each path comprising a multichannel vector FIR filter and a linear equation solver for generating least squares estimates of magnitude and phase pre-distortion coefficients, respectively.

3. The system as in claim 2, wherein the adaptive estimator includes a polynomial generator connected to the complex-to-magnitude (|u|) converter for generating a vector of different polynomial powers that forms an outer product, and a two-dimensional matrix FIR filter for averaging the outer product over time.

4. The system as in claim 3, wherein the first estimation loop comprises a feedback loop between the output and input of each multichannel vector FIR filter and the two-dimensional matrix FIR filter, each feedback loop including a delay (τ) and a multiplicative weighing coefficient.

5. The system as in claim 4, wherein the adaptive estimator includes a Matrix Formation block and feed forward parameters $\alpha_1$ and $\alpha_2$ whose outputs are respectively applied to a respective first input of each linear equation solver, a respective second input of each linear equation solver being connected to the respective output of each multichannel vector FIR filter.

6. The system as claimed in claim 5, wherein the parameters $\alpha_1$ and $\alpha_2$ are iterative adjusted following a power step from higher values for increased constraint on estimation error to progressively lower values for increasingly relaxed constraint on the estimation error.

7. The system as claimed in claim 6, wherein the parameters $\alpha_1$ and $\alpha_2$ are progressively reduced to zero.

8. The system as claimed in claim 6, wherein the parameters $\alpha_1$ and $\alpha_2$ are progressively reduced to a non-zero value for improved estimation robustness in response to a parametric variation.

9. A method of pre-distorting a signal applied to a power amplifier to compensate for distortion introduced by the power amplifier at different power settings, comprising:
   pre-distorting the signal according to a pre-distortion polynomial, prior to amplification of the signal by the power amplifier;

adaptively estimating and applying pre-distortion polynomial coefficients to the pre-distorter by saving successive iterations of adaptive estimation of the pre-distortion polynomial coefficients; and regularizing estimation of the pre-distortion polynomial coefficients over successive iterations according to a modified objective function that initially constrains growth in a magnitude of the pre-distortion polynomial coefficients and then relaxes the constraint in growth over successive iterations until an estimation is reduced to a steady-state least squares estimation.

10. The method as in claim 9, wherein regularizing estimation of the pre-distortion polynomial coefficients further includes formulating a constrained optimization problem using a modified objective function that minimizes estimation error of the pre-distortion polynomial coefficients and adds a weighted squared norm of the pre-distortion polynomial coefficients to the estimation error to regularize the estimation in the event that the magnitude of the pre-distortion polynomial coefficients exhibits unstable growth.

11. The method as claimed in claim 10, wherein the squared norm is weighted by a tunable parameter $\alpha$.

12. The method as claimed in claim 11, wherein the tunable parameter $\alpha$ is iterative adjusted following a power step from a higher value that increases the weight of the weighted squared norm for constraining the estimation error to progressively lower values for reducing the weight of the weighted squared norm for relaxing the constraint on the estimation error.

13. The method as claimed in claim 12, wherein the tunable parameter $\alpha$ is progressively reduced to zero.

14. The method as claimed in claim 12, wherein the tunable parameter $\alpha$ is progressively reduced to a non-zero value for improved estimation robustness in response to parametric variation.

* * * * *